(12) United States Patent
Chengalva

(10) Patent No.: US 6,445,589 B2
(45) Date of Patent: *Sep. 3, 2002

(54) METHOD OF EXTENDING LIFE EXPECTANCY OF SURFACE MOUNT COMPONENTS

(75) Inventor: Mahesh K. Chengalva, Kokomo, IN (US)

(73) Assignee: Delphi Technologies, Inc., Troy, MI (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/354,755

(22) Filed: Jul. 29, 1999

(51) Int. Cl.$^7$ .................................................. H05K 7/02
(52) U.S. Cl. ..................... 361/760; 763/765; 763/770; 228/180.21; 228/180.22; 174/255; 174/260
(58) Field of Search ......................... 361/760, 763–767, 361/770; 228/180.21, 180.22; 174/250, 259, 261, 267

(56) References Cited

U.S. PATENT DOCUMENTS

| | | | |
|---|---|---|---|
| 4,641,222 A | | 2/1987 | Derfiny et al. |
| 5,019,944 A | * | 5/1991 | Ishii et al. .................. 361/783 |
| 5,109,320 A | * | 4/1992 | Bourdelaise et al. ........ 361/785 |
| 5,186,383 A | * | 2/1993 | Melton et al. ........... 228/180.2 |
| 5,315,070 A | * | 5/1994 | Malwald ...................... 174/250 |
| 5,684,677 A | * | 11/1997 | Uchida et al. .............. 361/770 |
| 5,907,477 A | * | 5/1999 | Tuttle et al. ................ 361/760 |

FOREIGN PATENT DOCUMENTS

| | | |
|---|---|---|
| DE | 35 36 431 A1 | 12/1985 |
| JP | 06054503 | 2/1994 |
| JP | 07045926 | 2/1995 |
| JP | 07131586 | 5/1995 |
| JP | 11026910 | 1/1999 |

OTHER PUBLICATIONS

IBM Technical Disclosure Bulletin, Feb., 1989, Armonk, NY, US, vol. 31, No. 9.

* cited by examiner

*Primary Examiner*—Leo P. Picard
*Assistant Examiner*—David Foster
(74) *Attorney, Agent, or Firm*—Jimmy L. Funke

(57) ABSTRACT

A method of improving the life expectancy of surface mount components is electronic assemblies wherein a distance between the printed circuit board and the surface mount component is held to a predetermined distance defined as the stand-off height. The relationship between the stand-off height and the life expectancy of the component is directly proportional. A larger stand-off height translates into a longer life expectancy. The stand-off height is limited only by manufacturing constraints, such as process limitations and cost concerns. The stand-off height is set to a predetermined dimension by way of a spacer positioned between the surface mount component and the printed circuit board.

9 Claims, 2 Drawing Sheets

METHOD OF EXTENDING LIFE EXPECTANCY OF SURFACE MOUNT COMPONENTS

TECHNICAL FIELD

The present invention relates to surface mount components and more particularly to a method for extending the life expectancy of surface mount components by improving the reliability of a solder joint.

BACKGROUND OF THE INVENTION

Most electronic assemblies include surface mount components such as chip capacitors, chip resistors or the like. Standard, or conventional components are readily available at a very low cost, but with only average performance reliability. In the majority of applications, such as automotive applications, it is necessary to maintain a high level of performance reliability and consequently a long life expectancy for the surface mount components.

An alternative to standard components that increases the reliability of the component are specialized components whose performance is proven more reliable than standard components. The specialized components have compliant leads on the ends that induce lower strains on the solder joints as compared to components without leads, thereby improving the reliability. However, these components are manufactured using highly specialized processes, adding to the cost of the component and ultimately to the cost of the electronic assembly.

Another alternative is to improve the reliability of the solder joint, which ultimately translates into a more reliable surface mount component. This is because in surface mount designs, the height of the solder joint between the bottom of the surface mount component and the solder pad, known as the stand-off height, is an area subject to relatively high stresses under operating conditions. The stresses are mainly due to the difference in the thermal expansion of the surface mount component and the thermal expansion of the printed circuit board, which contributes to solder joint failure. An improved solder joint would allow a standard component to operate more reliably and on the same level as a specialized component. Up until now, the focus for improving solder joint reliability has been on modifying the shape of the solder joint.

One method of improving the solder joint reliability is to prevent solder from entering the area between the component and the pad. This design is difficult to manufacture and, therefore, extremely costly. Another method, discussed in U.S. Pat. No. 5,639,013, is to form a convex solder joint thereby increasing the stand-off height. In this method, a predetermined amount of solder is applied to the solder pads on a circuit board. A predetermined amount of solder is placed between the component and the solder pads. The solder is melted so that the component floats to a predetermined height above the circuit board and forms a convex shape.

The disadvantage of this method is that a convex solder joint is an unnatural shape for a solder joint and is extremely difficult to produce reliably. Often times during the manufacturing process of a convex solder joint, the surface mount component exhibits an undersirable effect known as "tombstoning". This undesirable effect is created by excess solder that causes the surface mount component to rotate vertically by 90 degrees and stand upright on one of the solder pads, mimicking a tombstone.

There is a need for a simple, reliable method of increasing the stand-off height of a surface mount component without the need for specialized components, unnatural solder joint shapes and excess solder.

SUMMARY OF THE INVENTION

The present invention is a method of increasing the life expectancy of surface mount components used in electronic assemblies. In particular, the life expectancy of a surface mount component can be significantly lengthened by increasing a stand-off height of the component from the printed circuit board. The stand-off height is defined as the distance between the bottom of the surface mount component and the printed circuit board. The stand-off height is controlled through the manufacturing process used to attach the surface mount component to the printed circuit board by inserting a spacer to set the stand-off height before soldering the component to the printed circuit board.

It has been determined through computer simulation that increasing the stand-off height considerably increases the life expectancy of the surface mount component. The method of the present invention improves the life expectancy of surface mount components, thereby improving the reliability of the component in harsher operating environments. In addition, a significant cost savings is realized because it is possible to replace specialized components with standard components and improve the reliability of the electronic assembly. For example, conventional low-cost chip resistors can replace expensive wire-wound resistors and still maintain high reliability of the electronic assembly.

It is an object of the present invention to provide a method for improving the life expectancy of surface mount components used in electronic assemblies. It is another object of the present invention to provide a significant cost saving to the cost of the electronic assembly. It is still another object of the present invention to use standard surface mount components and realize highly reliable electronic assemblies.

Other objects and features of the present invention will become apparent when viewed in light of the detailed description of the preferred embodiment when taken in conjunction with the attached drawings and appended claims.

BRIEF DESCRIPTION OF THE DRAWINGS

In order that the present invention may be well understood, there will now be described some embodiments thereof, given by way of example, with reference to the accompanying drawings, in which.

DESCRIPTION OF THE PREFERRED EMBODIMENT

Figure 1:
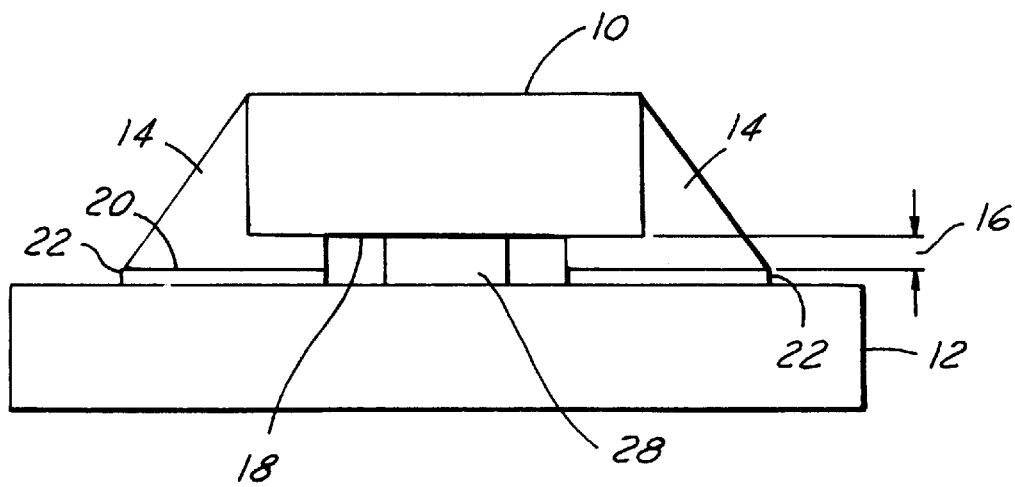
FIG. 1 is a cross-sectional view of a chip capacitor having a stand-off height determined according to the method of the present invention.

FIG. 1 is a cross section of a surface mount component 10 on a printed circuit board 12, having two quantities of solder 14 therebetween. A stand-off height 16 is defined as the distance between the bottom surface 18 of the surface mount component 10 and the top surface 20 of a mounting pad 22 on the surface of the printed circuit board 12.

A surface mount component 10 may include, but is not limited to, a chip resistor, a chip capacitor, a transistor, an integrated circuit, or any other component that is soldered to a printed circuit board.

Figure 2:
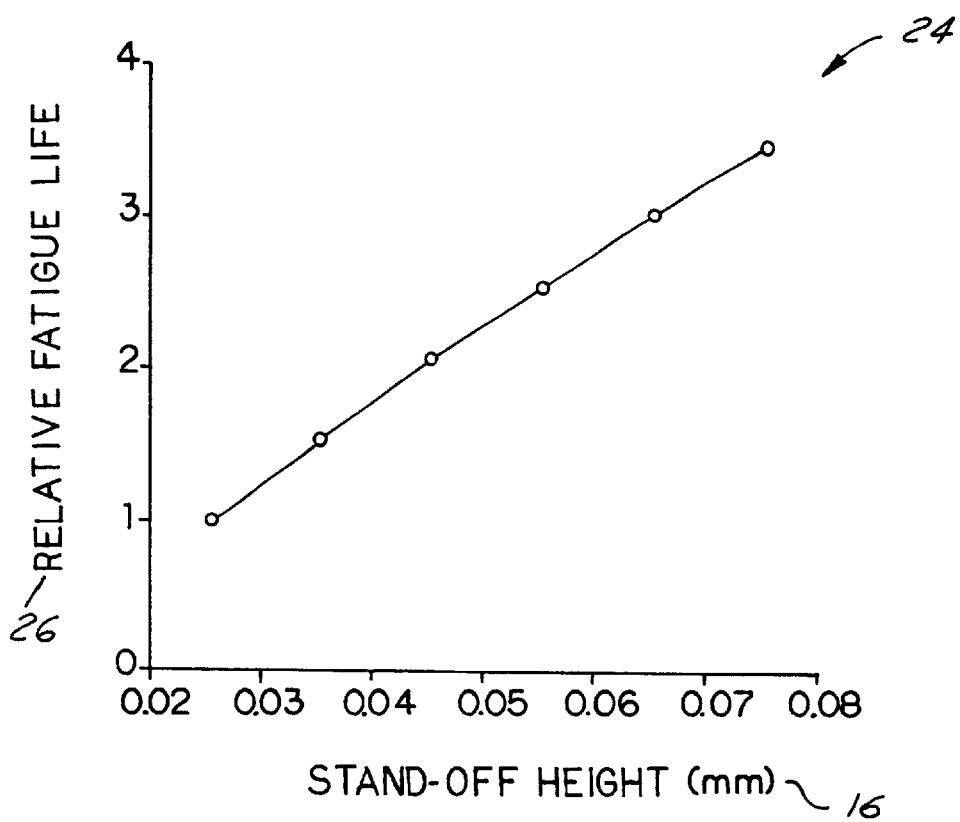
FIG. 2 is a graph showing the relationship between stand-off height and life expectancy of a surface mount component mounted using the method of the present invention.

A direct connection between the dimension of the stand-off height 16 and the life expectancy of the surface mount component 10 has been realized with the present invention. FIG. 2 is a graph 24 illustrating the correlation between the relative fatigue life 26 and the stand-off height 16 in millimeters. It is shown that the life expectancy is strongly dependent on the stand-off height.

A computer simulation, using parametric modeling software, was conducted in which the only variable was the stand-off height. In the simulation, a 1206 chip capacitor was subjected to a one hour −40° C. to 150° C. temperature cycle of fifteen minute ramps and dwells.

The results are shown in Table 1 below. The standoff height was varied from 0.0254 mm to 0.0750 mm. The creep energy dissipation density per temperature cycle in the solder is shown as $N/mm^2$. The relative fatigue life is in column 3 of the table.

TABLE 1

| Standoff Height (mm) | Energy Density ($N/mm^2$) | Relative Fatigue Life |
|---|---|---|
| 0.0254 | 0.2847 | 1 |
| 0.0354 | 0.2296 | 1.545 |
| 0.0454 | 0.1983 | 2.078 |
| 0.0554 | 0.1783 | 2.549 |
| 0.654 | 0.1644 | 3.0379 |
| 0.0754 | 0.1538 | 3.476 |

The creep energy density, in $N/mm^2$, represents the change in creep energy dissipation during the temperature cycle. The relative fatigue life is the relative number of cycles to failure of the surface mount component. The surface mount component is cycled at a predetermined standoff height until failure, and the number of cycles is recorded. The standoff height is then increased by a predetermined amount and a surface mount component is cycled again until failure. Column 3 shows the relative fatigue life, which is a measure of those cycles relative to each other, with the only variable being the standoff height.

A relationship between the relative fatigue life and the energy density is given by the equation:

$$N_1/N_2=(E_2/E_1)^k$$

where $E_1$ and $E_2$ are the energy densities in the solder boundary layer, $N_1$ and $N_2$ are the corresponding cycles to failure, and k is a constant, (2.0235 in the present example), relating to solder fatigue. The solder fatigue constant is easily obtainable by one of ordinary skill in the art.

The results of the computer simulation show that the chip standoff height is a factor in the life expectancy of surface mount components. As the stand-off height is increased, the life expectancy of the component is similarly increased. The height of the stand-off dimension is limited only by manufacturing constraints and cost concerns. However, it is possible to improve the reliability of electronic assemblies, using conventional components, by increasing the stand-off height dimension of the component relative to the printed circuit board.

The stand-off height can be controlled according to the method of the present invention. A spacer 28, or tab, is strategically placed between the surface mount component 10 and the top surface of the printed circuit board 12. The spacer 28 has predetermined dimensions such that its placement in relation to the surface mount component defines the stand-off height dimension.

Figure 3A:
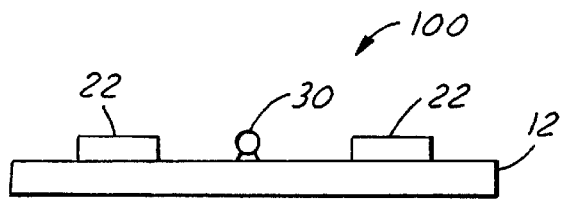
FIG. 3 is a pictorial flow diagram of the steps of the method of the present invention.
Figure 3B:
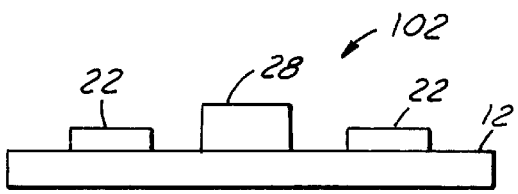

According to the method of the present invention, described herein with reference to FIGS. 3A-3F. Referring to FIG. 3A, the printed circuit board 12 is shown with two pads 22 spaced a distance from each other. Adhesive material 30, or other suitable material, is deposited 100 on the printed circuit board so that the spacer 28 will adhere to the printed circuit board 12 as shown in FIG. 3B. The adhesive need only be strong enough to hold the spacer 28 temporarily until the solder process is complete, at which time the solder joint provides the permanent attachment of the surface mount component to the printed circuit board at the predetermined stand-off height.

Figure 3C:
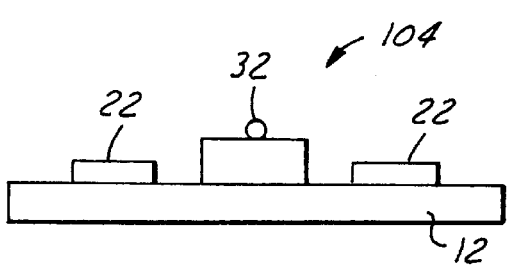
Figure 3D:
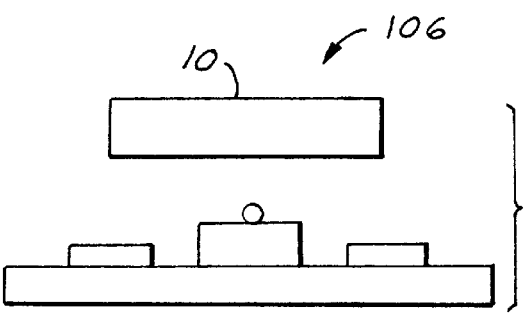
Figure 3E:
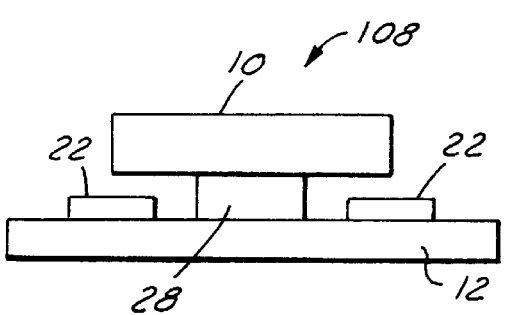
Figure 3F:
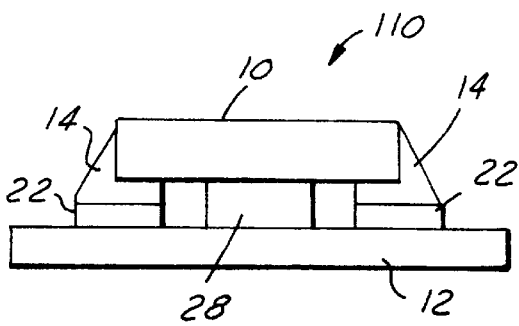

Referring now to FIG. 3B, the spacer 28 is attached 102 to the circuit board 12 by the adhesive material 30. Additional adhesive material 32 is deposited 104 on the spacer 28 as shown in FIG. 3C. The surface mount component 10 is positioned above the spacer 28, as shown in 106 of FIG. 3D and then attached 108 as shown in FIG. 3E to the spacer 28 and temporarily held in place by the adhesive material 32. The stand-off height is determined by the height of the spacer 28. Referring to FIG. 3F, the surface mount component 10 is soldered 110 by solder 14 to the pads 22 according to any conventional means known to one of ordinary skill in the art, such as reflow. In this regard, the solder material is melted at either end of the surface mount component and forms solidified solder joints at each end. In the completed assembly, the surface mount component 10 is held securely by the solder joints 14 to a desired stand-off height dimension.

The spacer 28 may be of a plastic material, or any other suitable material, preferably having a low cost. The adhesive material 30, 32 need only be strong enough to hold the spacer 28 in place temporarily until the solder joint 14 is formed and solidified. Once the solder joints 14 have formed, the spacer 28 is secure between the printed circuit board 12 and the surface mount component 10.

In another embodiment of the present invention, the spacer 28 is integral to the surface mount component 10. The spacer 28 is a tab or similar structure that is part of the exterior of the surface mount component 10. In this embodiment it is not necessary to apply adhesive material between the surface mount component and the spacer 28.

In yet another embodiment of the present invention, the spacer 28 is integral to the printed circuit board 12. The spacer 28 is an extension of the printed circuit board 12. In this embodiment it is not necessary to apply adhesive material between the printed circuit board and the spacer.

While particular embodiments of the invention have been shown and described, numerous variations and alternate embodiments will occur to those skilled in the art. Accordingly, it is intended that the invention be limited only in terms of the appended claims.

What is claim is:

1. A method of extending the life expectancy of a surface mount component printed on a circuit board, said method comprising the steps of:

temporarily mounting a plastic spacer to said printed circuit board, said plastic spacer being temporarily fixed to said printed circuit board and having a predetermined height dimension between said surface mount component and said printed circuit board; and soldering said surface mount component to said printed circuit board with at least two solder joints whereby said surface mount component is spaced a predetermined distance from said printed circuit board, said spacer being temporarily fixed to said printed circuit board for maintaining said predetermined height dimension and preventing secondary stresses in said at least two solder joints.

2. The method as claimed in claim 1 wherein said step of inserting said spacer further comprises the steps of:

adhering said spacer to said printed circuit board; and adhering said surface mount component to said spacer.

3. The method as claimed in claim 1 wherein said step of soldering said surface mount component further comprises:

melting a solder material at either end of said surface mount component; and forming a solidified solder joint at either end of said surface mount component, whereby said surface mount component is a predetermined height above said printed circuit board, said predetermined height being determined by said spacer.

4. A method of spacing a surface mount component to a predetermined stand-off height from a printed circuit board, said method comprising the steps of:

temporarily attaching a plastic to said printed circuit board, said plastic spacer being temporarily fixed to said printed circuit board and having a predetermined height between said printed circuit board and said surface mount component, said spacer being positioned between at least two solder pads spaced a distance from each other; and soldering said surface mount component to said at least two solder pads such that said spacer being temporarily fixed to said printed circuit board defines said predetermined stand-off height between said surface mount component and said printed circuit board thereby preventing secondary stresses in said at least two solder pads.

5. The method as claimed in claim 4 wherein said step of attaching said spacer further comprises applying an adhesive material between said spacer and said printed circuit board and between said spacer and said surface mount component.

6. The method as claimed in claim 4 wherein said step of soldering further comprises:

melting a solder material at either end of said surface mount component; and forming a solidified solder joint at either end of said surface mount component, whereby said surface mount component is a predetermined height above said printed circuit board, said predetermined height being determined by said spacer.

7. An electronic assembly comprising:

at least one surface mount component from the group consisting of a chip resistor;

a chip capacitor;

a transistor;

an integrated circuit;

a printed circuit board;

at least two pads at each end of said surface mount component between said surface mount component and said printed circuit board;

a spacer positioned between said at least two pads below said surface mount component and above said printed circuit board, said spacer having a predetermined height;

a solder joint at said at least two pads for affixing said surface mount component to said printed circuit board; and whereby said predetermined height defines a stand-off height between said surface mount component and said printed circuit board.

8. The electronic assembly as claimed in claim 7 wherein said surface mount component is selected from the group consisting of a chip resistor, a chip capacitor, a transistor, and an integrated circuit.

9. The electronic assembly as claimed in claim 7 wherein said spacer has an adhesive material for attaching said spacer to said surface mount component and said printed circuit board.

* * * * *